United States Patent [19]

Gerber et al.

[11] 4,399,523

[45] Aug. 16, 1983

[54] NON-VOLATILE, ELECTRICALLY ERASABLE AND REPROGRAMMABLE MEMORY ELEMENT

[75] Inventors: Bernard Gerber; Jean Fellrath, both of Neuchatel, Switzerland

[73] Assignee: Centre Electronique Horloger SA, Neuchatel, Switzerland

[21] Appl. No.: 180,488

[22] Filed: Aug. 22, 1980

[30] Foreign Application Priority Data

Aug. 24, 1979 [CH] Switzerland .......................... 7711/79
Mar. 24, 1980 [CH] Switzerland .......................... 2271/80

[51] Int. Cl.³ ............................................ G11C 11/40
[52] U.S. Cl. .................................... 365/218; 365/103; 365/174
[58] Field of Search ............... 365/218, 103, 104, 182, 365/185

[56] References Cited

U.S. PATENT DOCUMENTS 4,209,849 6/1980 Schrenk ............................. 365/218

Primary Examiner—Terrell W. Fears
Attorney, Agent, or Firm—Cushman, Darby and Cushman

[57] ABSTRACT

The invention relates to non-volatile electrically erasable and reprogrammable memories produced by CMOS technology.

According to the invention, each memory element comprises only a single p-channel transistor having a polycrystalline silicon floating gate capacitively coupled to a control electrode. The thicknesses of injection oxide and gate oxide are such that the element can be programmed by avalanche of the drain-substrate junction and erased by field emission of electrons from the floating gate towards the substrate.

All the voltages required can be generated on the circuit of the memory from a battery voltage of 1.5 volts.

13 Claims, 13 Drawing Figures

NON-VOLATILE, ELECTRICALLY ERASABLE AND REPROGRAMMABLE MEMORY ELEMENT

The present invention relates to a non-volatile, electrically erasable and reprogrammable memory element produced by polycrystalline silicon gate CMOS technology and comprising only a single p-channel MOS transistor having a floating gate capacitively coupled to a control electrode.

Memory elements which are capable of retaining information for long periods and are coupled capacitively to a control electrode are already known. The following references can be quoted in particular:

(1) Y. Tarui, Y. Hayashi and K. Nagai, "Electrically reprogrammable nonvolatile semiconductor memory", IEEE J. Solid-State Circuits, Vol. SC-7, pp. 369–375, 1972.

(2) H. Iizuka, F. Masuoka, T. Sato and M. Ishikawa, "Electrically Alterable Avalanche-Injection-Type MOS READ-ONLY Memory with Stacked-Gate Structure", IEEE Trans. on Electron Devices, Vol. ED-23, pp. 379–387, 1976.

(3) B. Agusta and J. J. Chang, "Non volatile semiconductor storage device utilizing avalanche injection and extraction of stored information", U.S. Pat. No. 3,797,000.

(4) J. F. Verwey and R. P. Kramer, "ATMOS-An Electrically Reprogrammable Read-Only Memory Device", IEEE Trans. on Electron Devices, Vol. ED21 No 10, pp. 631–636, 1974.

(5) J. W. Kelley and D. F. Millet, "An Electrically alterable ROM and it doesn't use nitride", Electronics, pp 101–104, Dec. 9, 1976.

(6) B. Rössler, "Electrically Erasable and Reprogrammable Read-Only Memory using the n-Channel SIMOS One-Transistor Cell", IEEE Trans. on Electron Devices, Vol. Ed-24, No 5, pp. 606–610, 1977.

(7) E. G. Müller, H. Nietsch, B. Rössler and E. Wolter, "An 8192-Bit Electrically Alterable ROM Employing a One-Transistor Cell with Floating Gate", IEEE J. of Solid-State Circuits, Vol. SC-12, No 5, 1977.

(8) W. M. Gosney, "DIFMOS-A Floating gate electrically erasable non volatile semiconductor memory technology", IEEE Trans. on Electron Devices, Vol. ED-24, pp. 594–599, 1977.

The main programming and erasure mechanisms employed are:

injection of electrons by avalanche of a p+-n junction (references 1,2,3,5,8);

injection of holes by avalanche of a n+-p junction (references 1,4,5,8);

injection of electrons from the channel of an n-channel transistor (references 1,6,7);

injection of electrons by field emission from the floating gate to the control electrode (reference 2) or towards the source or the channel of the transistor (references 6,7);

injection of electrons by avalanche in the polycrystalline silicon (reference 3).

The field emission mechanism has been described in detail in the following reference:

(9) M. Lenzlinger and E. H. Snow, "Fowler-Nordheim tunneling into thermally grown $SiO_2$", J. Appl. Phys., Vol. 40, pp. 278–283, 1969.

On the other hand, an increase in the capacitive coupling between the floating gate and the control electrode has been proposed in the following reference:

(10) B. Rössler, "Feldeffekttransistor mit isoliertem, schwebenden Speichergate" Swiss Pat. No. 601'895.

In the known memory elements, the writing and/or erasure mechanisms are generally such that they entail high energy consumption or demand high control voltages, necessitating external sources of control signals, that is to say sources which are not fabricated on the same integrated circuit as the memory. The devices in references 2 and 3 require writing and erasure voltages having opposite signs which are difficult to switch. Selective writing is often carried out by superimposing two voltages having opposite signs. Erasure is generally non-selective. Moreover, the memories described are usually incompatible with standard polycrystalline silicon gate CMOS technology.

The SAMOS structure described in reference 2 utilises an additional selection transistor to permit selective reading of the memory and requires positive and negative voltages for the programming thereof.

A one-transistor memory element capable of being used in a memory organised in matrix form is described in reference 7. This is an n-channel memory element with a double polycrystalline silicon gate, one gate being used as floating gate and the other as control electrode. Programming is effected by injection of electrons from the channel region towards the floating gate, causing the transistor to conduct strongly by the application of two positive voltages to the drain and the control electrode. The voltages needed for programming a cell of this type are limited by using a very short (3.5 $\mu$m) funnel-like channel. A current of several milliamperes is therefore needed for writing, and the threshold voltage of the transistor is raised by the presence of the negative charge stored in the gate. Erasure is effected by field emission of electrons from the floating gate towards the source of the positively polarised element through an oxide of reduced thickness to prevent breakdown of the source-substrate junction. As this field emission is not self-limiting and constitutes a poorly controlled phenomenon, it may result in the accumulation of a positive charge on the floating gate which would make the memory element conductive at zero control voltage. This disadvantage is overcome by a tetrode-type arrangement. Reading is effected by testing the state of conduction of the cell using the control electrode.

The object of the present invention is to overcome the disadvantages of the known memory devices and, in particular, to provide a single-transistor memory element which is compatible with polycrystalline silicon gate CMOS technology, can be erased and reprogrammed by means of voltages capable of being produced on the same integrated circuit as the memory from the supply voltage of a battery and which can be used in a particularly simple manner in a matrix arrangement.

According to one aspect of the present invention there is provided a non-volatile, electrically erasable and re-programmable memory element produced by means of polycrystalline silicon gate CMOS technology and comprising only a single p-channel MOS transistor with a floating gate capacitively coupled to a control electrode, the said memory element being characterised in that:

the said polycrystalline silicon floating gate is arranged, at least over a portion of the channel region, on a thin injection-type oxide and, outside the channel region, on a field oxide layer which is substantially thicker;

the said control electrode covers the said floating gate and is separated from said floating gate by at least one gate oxide layer which is substantially thicker than the said injection-type oxide; and the thickness of the said injection-type oxide and the said gate oxide is chosen so that the said floating gate can be negatively charged by avalanche of the drain-substrate junction and can be discharged by field emission of electrons from the said floating gate towards the substrate by applying a negative voltage to the said control electrode.

According to a second aspect of the present invention there is provided a non-volatile and reprogrammable memory element comprising a single p-channel MOS transistor with a polycrystalline silicon floating gate capacitively coupled to a control electrode, wherein, said polycrystalline silicon floating gate is arranged, at least over a portion of the channel region, on a thin injection-type oxide and, outside the channel region, on a field oxide which is substantially thicker:

said control electrode covers said floating gate and the channel region not covered by the floating gate, said control electrode being separated from said floating gate and from said channel region not covered by the floating gate, by at least one gate oxide layer which is substantially thicker than the said injection-type oxide; and the thickness of said injection-type oxide and said gate oxide is chosen so that said floating gate can be negatively charged by avalanche of the drain-substrate junction and can be discharged by field emission of electrons from said floating gate towards the substrate by applying a negative voltage to the said control electrode.

Embodiments of the invention have a number of advantages over the above-described prior art, namely the implementation of a memory by matrix arrangement of single-transistor cells requires only a few connections per element;

the substrate is always on ground potential;

the manufacture of the memory requires only one more mask than in standard polycrystalline silicon gate CMOS technology;

the writing and erasure mechanisms imply very low power dissipation, permitting the necessary voltages to be generated on the memory circuit itself with the aid of completely integrated voltage multipliers;

the programming and reading voltages all have the same sign and can therefore easily be switched by logic circuits;

the memory element does not require a short channel length which is difficult to control.

The invention will now be described further, by way of example, with reference to the accompanying drawings, in which:

FIG. 1 shows a section of a memory element having a similar configuration to a known element (reference 2) and permitting the principle employed in the memory element according to the invention to be explained.

FIG. 1 shows a transistor $T_M$ produced by CMOS technology and having a polycrystalline silicon floating gate $G_1$. Silicon gate CMOS technology is described, for example, in the following reference:

(11) B. Gerber and F. Leuenberger, "Circuit a transistors MOS complementaires et son procede de fabrication", Swiss Pat. No. 542'518.

The $p^+$-doped drain and source regions formed in an n-type substrate 1 are designated by 2 and 2' respectively. Corresponding connecting portions D and S are indicated in broken lines.

An oxide layer 3 covers, in particular, the floating gate and the regions 2 and 2'. It is traversed by windows indicated in broken lines to permit contact between the regions 2 and 2' and the portions D and S.

A control electrode $G_2$ is arranged on the oxide layer 3 opposite the floating gate $G_1$. It is connected to an external connecting portion (not shown) and can be produced, for example, from aluminum or from polycrystalline silicon in a similar manner to the connecting portions D and S.

Figure 1:
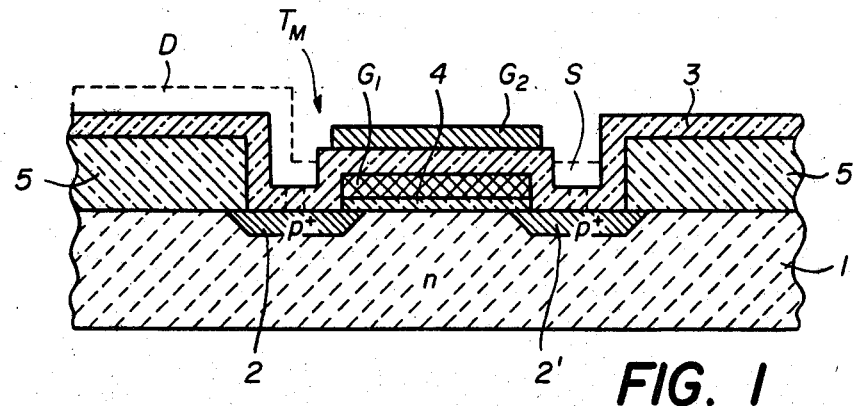
FIG. 1 is a sectional view of a memory element of known structure allowing to explain the programming mechanisms employed in the present invention.

In FIG. 1, a gate oxide layer 4 separates the floating gate $G_1$ from the substrate and the regions 2,2', the field oxide being designated by 5. The gate oxide layer is thinner than the oxide layer 3 and much thinner than the field oxide layer 5.

The capacitive coupling between the floating gate and the control gate is preferably increased in a known manner by extending these electrodes, separated by the oxide layer 3, across the field oxide, perpendicularly to the plane of the drawing.

The programming and operation of a memory element according to the invention can be explained in the following manner.

Figure 2:
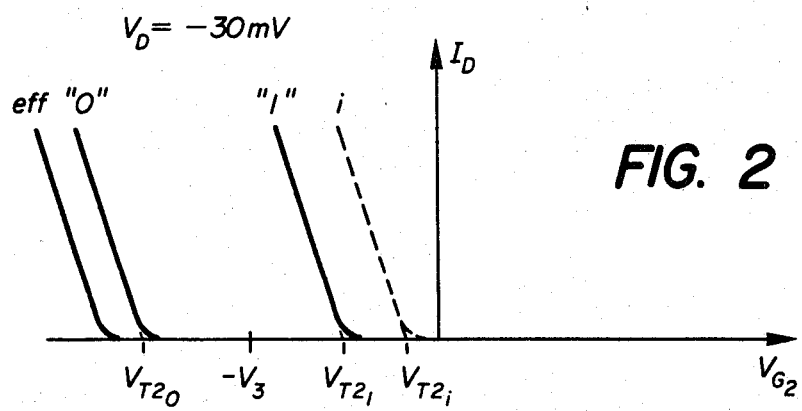
FIG. 2 is a diagram showing the drain current-control voltage characteristics in various states in an embodiment of the memory element according to the invention.

In the initial state, the floating gate of the memory element is not charged and no current circulates towards the source when a conventional supply voltage, for example of $-1.5$ V, is applied to the drain, the control electrode and the source being at ground potential. The threshold voltage of the memory element can be determined by extrapolating, in a given state of the memory element, the characteristic $I_D=f(V_{G2})$ as a function of the control voltage $V_{G2}$ to $I_D=0$, as shown in FIG. 2. For low voltage CMOS technology, the threshold voltage corresponding to the initial state, $V_{T2i}$, is approximately $-0.5$ V. The initial state is represented by the dotted characteristic in FIG. 2.

By applying a sufficiently high negative voltage $-V_2$ to the control electrode $G_2$, electrons are emitted from the floating gate to the substrate through the gate oxide layer 4 by field emission. The floating gate $G_1$ is thus positively charged, making the threshold voltage even more negative. The memory element is erased in this manner (characteristic "eff" in FIG. 2).

By maintaining the electrode $G_2$ at ground potential and by applying an appropriate negative voltage $-V_1$ to the drain, the $p^+n$-junction of the transistor drain is brought into avalanche. Sufficiently energetic hot electrons are then injected into the floating gate through the gate oxide layer and $G_1$ charges negatively. Writing the memory element is effected in this way. With sufficiently long pulse times, it is observed that the threshold voltage of the memory element in the written state depends linearly on the writing voltage $-V_1$. According to the invention, writing is carried out in such a way that the threshold voltage of the memory element in the written state, and particularly in the so-called "1" state of writing, remains negative preventing, in particular, the passage of a parasitic current between the drain and the source during writing. In FIG. 2, the written state "1" is represented by the characteristic "1", the corresponding threshold voltage $V_{T21}$ being, for example, $-5$ V.

From the erased state, the writing of the other state of the memory element known as "0" will be effected by simultaneously applying voltage $-V_1$ to the drain and a voltage $-V_3$, for example of $-10$ V, to the control electrode. The breakdown voltage of the $p^+n$-junction beneath the floating gate will thus be increased. If the threshold voltage of the memory element is sufficiently negative in the erased state, the element will be written in the "0" state at a threshold voltage about 10 V lower than that obtained with $V_{G2}=0$, for example at $V_{T20}=-15$ V. A 10 V window is thus obtained between the "0" state and the "1" state. For reading purposes, it will consequently be sufficient to apply to the control electrode a reading voltage of a value comprised between the two threshold voltages $V_{T20}$ and $V_{T21}$, for example $-V_3=-10$ V, and to supply the transistor by applying to its drain the supply voltage which is, as mentioned, $-1.5$ V. If the memory element is in the "1" state, a corresponding current $I_D$ will circulate between the drain and the source of the transistor $T_M$. On the other hand, if the memory is in the "0" state, no current will circulate during reading.

It should be noted that in the present memory element, the substrate can always be at ground potential and the source of the transistor can remain connected to the substrate during all the programming operations. It should also be noted that with the programming according to the invention the threshold voltage of the memory element in the written state, and particularly $V_{T21}$ ($>V_{T20}$), is always negative as illustrated in FIG. 2 so that $T_M$ never becomes conductive at zero control voltage.

Figure 3:
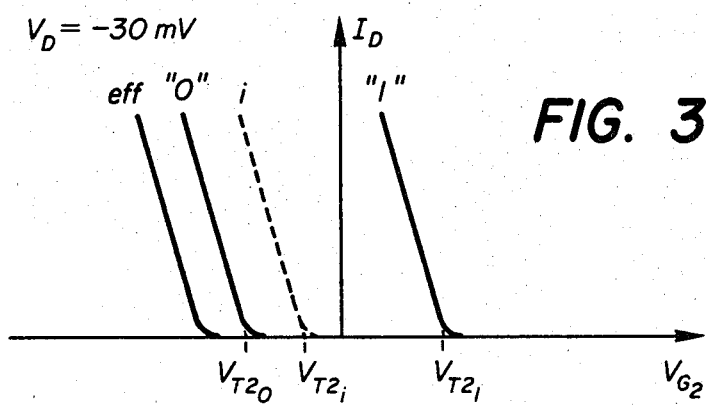
FIG. 3 is a diagram similar to the one in FIG. 2, showing the corresponding characteristics in the case of different control from that of the invention.

In comparison with the programming of a memory element in which the threshold voltage after erasure would also be negative but the threshold voltage after writing of the "1" state would be positive, as illustrated in FIG. 3 in which $V_{T21}>0$, the voltage to be applied to the control electrode for erasure should be raised in the memory element according to the invention in absolute value, for example by about 10 to 15 V, and the voltage producing the writing should be reduced by the same amount, thus increasing the dissymmetry between these two negative voltages, the voltage needed for erasure by field emission always being higher in absolute value than that producing the writing by avalanche.

In a preferred form of a first embodiment of the invention, the memory element is designed so as to have an initial threshold voltage which is already markedly negative, for example, $V_{T21}=-10$ V. The erasure voltage to be applied to the control electrode in order to obtain the same threshold voltage in the erased state as in the element in FIG. 1 will thus be reduced, for example by about 10 V.

This is effected by arranging a portion of the gate of the transistor $T_M$ on a field oxide layer, between the drain and the source of the transistor.

Figure 4:
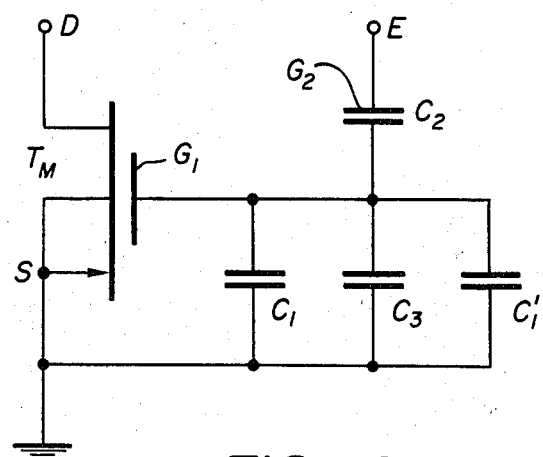
FIG. 4 is a diagram of the equivalent electric circuit of first and second embodiments of the memory element according to the invention.
Figure 5:
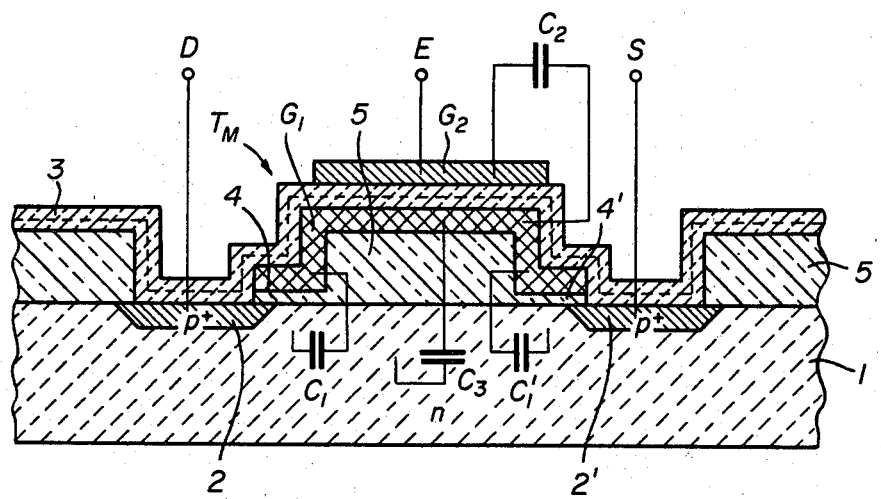
FIG. 5 is a sectional view of a first embodiment of a memory element corresponding to the circuit in FIG. 4.

A memory element of this type is shown in section in FIG. 5, and corresponds to the electrical diagram in FIG. 4.

In these figures, and in the remainder of the description, the parts corresponding to similar parts in FIG. 1 have been designated by the same reference numerals.

In the memory element in FIG. 5, the floating gate $G_1$ has a central portion arranged on a field oxide layer 5 having a thickness of approximately 10,000 Å and two lateral regions arranged on gate oxide layers designated by 4 and 4' respectively, the thickness of the latter being about 750 Å. These thin oxide layers 4 and 4' situated beneath the floating gate $G_1$ are also known as injection-type oxide layers because the injection of electrons from the substrate into the floating gate will be effected through them. In the vicinity of these injection-type oxide layers, some $p^+$-doped regions designated by 2 and 2', respectively, are formed in an n-type substrate 1. These regions 2 and 2' constitute the drain and source regions respectively of the transistor $T_M$ and are aligned relative to the gate $G_1$.

The control electrode $G_2$ is separated from the central portion of the gate $G_1$ by an oxide layer 3 extending over the remainder of the surface of the element in a manner similar to that in FIG. 1. This layer 3 can be produced in two superimposed portions, as indicated by the broken separating line in FIG. 5, one of the portions being doped, for example, with boron and the other with phosphorus, as indicated below in the context of another embodiment.

FIG. 5 also shows schematically the drain D, source S and control electrode E connections which are also represented in the diagram in FIG. 4.

A capacitance designated by $C_2$ appears between the floating gate $G_1$ and the control electrode $G_2$.

The capacitances appearing between the floating gate $G_1$ and the substrate are represented by $C_1$, $C_3$ and $C'_1$ and correspond to the lateral drain, central and lateral source portions, respectively.

The coupling between the floating gate and control electrode is expressed by the equation $\alpha=C_2/(C_2+C_1+C'_1+C_3)$. The best coupling will therefore be obtained by minimising $C_1$ and $C'_1$ and by increasing $C_2$.

The writing voltage to be applied to the drain and the erasure voltage to be applied to the control electrode can be reduced substantially by reducing the thickness of the injection oxide. Experiments have demonstrated that the voltage needed for erasure is directly proportional to this thickness. It has also been found that n+-doping of the floating gate reduces the potential barrier at the interface between the polycrystalline silicon and injection oxide and assists erasure of the structure.

The properties of the memory element in FIG. 5 can therefore be further improved by applying these measures.

Figure 6:
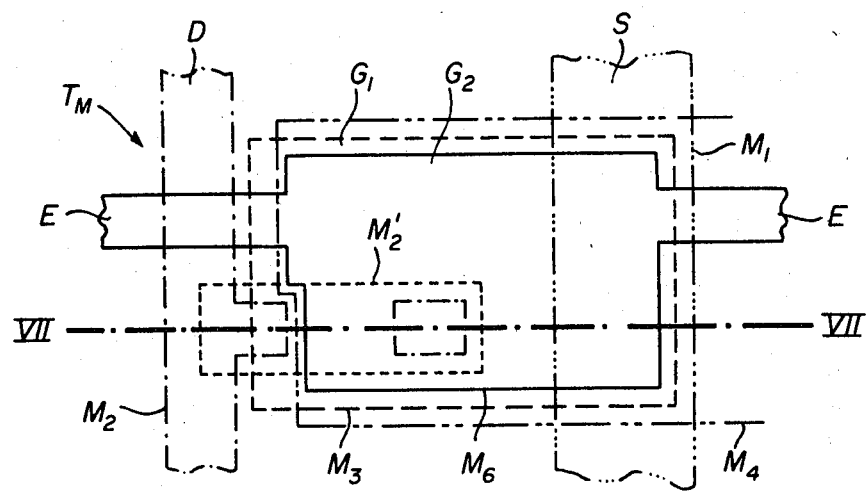
FIG. 6 is a plan view of a second embodiment of a memory element corresponding to the circuit in FIG. 4, in the form of a mask plan of the corresponding integrated circuit.
Figure 7:
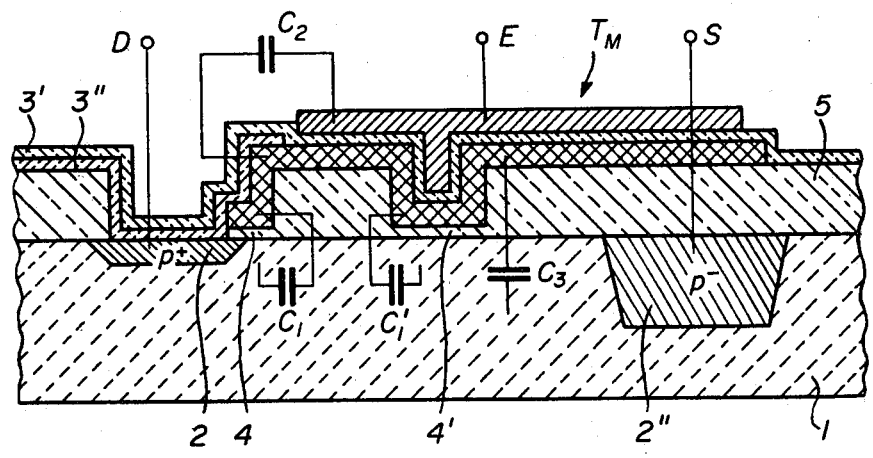
FIG. 7 is a sectional view along line VII—VII in FIG. 6.

Another particularly advantageous embodiment of such an element is shown in FIGS. 6 and 7.

This memory element also corresponds to the equivalent electrical diagram in FIG. 4 and comprises similar parts to the preceeding examples. The control electrode $G_2$ has a connection E, the portions $G_2$ and E being produced, for example, from aluminum. The drain D and source S connections of $T_M$ are shown schematically in FIG. 7 and are produced, for example, by diffusion.

The floating gate $G_1$ has a portion arranged on a field oxide layer 5 which is approximately 10,000 Å thick and covers the substrate 1 and a p⁻-doped well designated by 2″. This well forms the source region of the transistor $T_M$. Furthermore, $G_1$ has two portions arranged on injection oxide layers 4 and 4′, respectively, which are 200 Å thick for example. In the vicinity of the injection oxide layer 4, a p+-doped region designated by 2 is formed in the n-type substrate 1. The region 2 constitutes the drain region of the transistor $T_M$ and is automatically aligned relative to the gate $G_1$. FIG. 7 also shows oxide layers 3′ and 3″, the oxide of layer 3′ being doped with phosphorus and the oxide of 3″ with boron. In the embodiment described here, they act as a diffusion source and permit the regions to be diffused and the polycrystalline silicon gate to be doped p+ and n+ simultaneously.

FIG. 6 shows the arrangement of the various portions of the memory element viewed from above and actually constitutes the mask plan which can be used for manufacturing the circuit.

The manufacturing process adopted in this example employs CMOS technology, as described in particular in reference 11. An additional mask $M'_2$ is needed for manufacturing the present circuit, as compared to the abovementioned technology which utilises masks designated by $M_1$ to $M_6$.

A first mask $M_1$ serves to form the wells of any n-channel transistors which may form part of the whole memory device (decoder circuits). In this case it serves to form the source region of the transistor $T_M$ of the memory element.

A mask $M_2$ defines the windows surrounding the source, drain and gate regions of the transistors. It defines the drain region of the transistor $T_M$ as well as the regions of the floating gate on the injection oxide layers 4 and 4′.

The mask $M'_2$ serves to etch the gate oxide layers after partial growth. The growth of the gate oxide is then continued until the conventional thickness of about 750 Å is obtained in the gate regions of any other transistors of the memory device not forming the memory elements. Owing to the additional mask $M'_2$, the injection oxide layers 4 and 4′ will have only a reduced thickness, as required by the present memory element if voltages are to be generated and switched by means of other integrated circuits on the same wafer of silicon.

The mask $M_3$ serves to define the polycrystalline silicon floating electrode $G_1$ as well as the gates of any other p and n channel transistors produced on the same substrate. It will be noted that the floating electrode is placed on a field oxide layer and, in the regions defined by $M_2$ and $M'_2$, on injection oxide layers of reduced thickness.

The mask $M_4$ serves to define the boron doped oxide layer 3″ and, consequently, the regions which will be doped p+ from 3″ and n+-doped from 3′.

The following mask, designated by $M_5$, permits windows to be opened through the layers 3′ and 3″ to allow a contact to be produced between the p+ and n+ diffused regions (mono and polycrystalline silicon) and metallic connecting members. These windows are not shown in FIG. 6 as they are assumed to be located at another point of the circuit. It should be pointed out that the polycrystalline silicone electrode $G_1$ is completely coated with oxide and is not made accessible by a contact window.

The last mask $M_6$ defines the metal portions, in particular the control electrode $G_2$ and its connecting portion E, by etching in a previously deposited aluminum layer.

The source of the transistor $T_M$ of the memory element has been produced by means of a p⁻ well instead of a p+ diffusion region, as in the example in FIG. 5, in order to increase the capacitive coupling between the gates $G_1$ and $G_2$ and to permit a link between the sources beneath the floating gate. This allows the integration density of the circuit to be increased.

The coupling between the gates $G_1$ and $G_2$ is effected through a single doped oxide layer 3′ which, on the one hand, increases this coupling and, on the other hand, permits the gate $G_1$ to be n+-doped to promote the field emission of electrons towards the substrate through the injection oxide layer 4′. The window in which the oxide 4′ has been grown is not adjacent to that of the layer 4 to permit the entire floating gate outside the drain region to be n+-doped without any alignment tolerance. This would not be the case if the polycrystalline silicon were partially doped above the layer 4 as it is necessary to prevent n+-doping in the diffused region 2.

The present memory element operates in a similar manner to that described with reference to the element in FIG. 5.

By way of example, a memory element according to FIGS. 6 and 7 can have the following dimensions:

| | |
|---|---|
| Thickness of the injection oxide layers 4 and 4′ | 200 A |
| Thickness of the field oxide layer 5 | 10,000 A |
| Thickness of the oxide layer doped with phosphorus 3′ | 2,750 A |
| Surface area determining $C_1$ | 25 $\mu m^2$ |
| Surface area determining $C'_1$ | 25 $\mu m^2$ |
| Surface area determining $C_2$ | 2460 $\mu m^2$ |
| Surface area determining $C_3$ | 2845 $\mu m^2$ |

The capacitive coupling between $G_1$ and $G_2$ is therefore $\alpha = 0.63$.

The voltage needed to erase the memory, in order to obtain a threshold voltage in the erased state $V_{T2eff} = -20$ V, is approximately $-30$ V with an application time of 250 ms. The writing operation to obtain a threshold voltage $V_{T21} = -5$ V requires a voltage of approximately $-18$ V, also with a pulse time of 250 ms.

It should be noted that in the present memory element the n⁻-substrate always remains at ground potential, and the transistor source remains at the potential of the substrate during all the programming operations.

Figure 8:
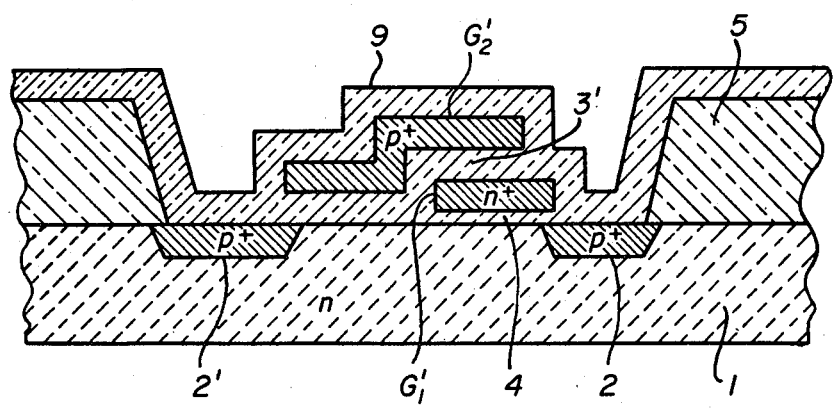
FIG. 8 is a sectional view along the axis A—A' of the memory element shown in FIG. 9.
Figure 9:
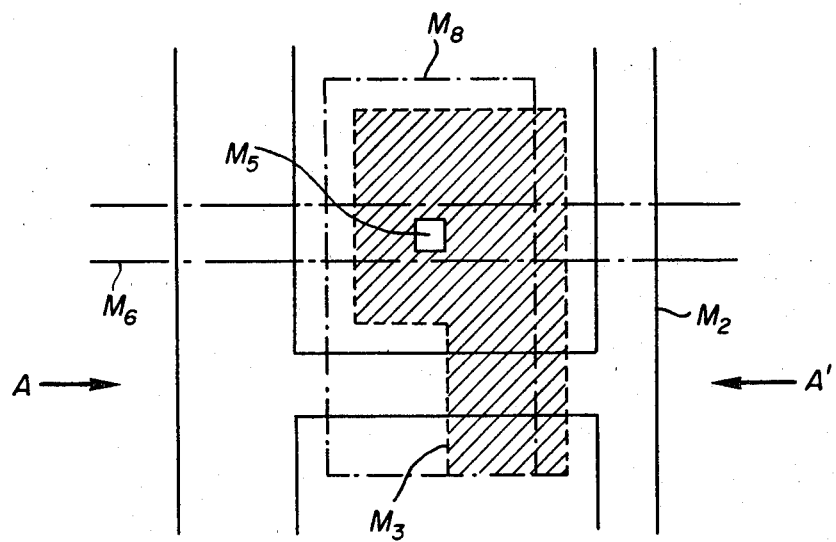
FIG. 9 is a plan view of the realization in integrated form of a third embodiment of the memory element according to the invention.
Figure 10:
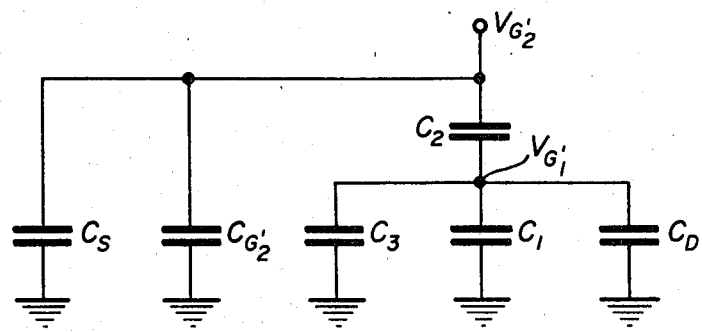
FIG. 10 shows the equivalent circuit of the memory element shown in FIGS. 8 and 9.

The memory element shown in FIGS. 8, 9 and 10 constitutes another embodiment of the invention. The programming mechanisms are identical to those described above but, in this embodiment, are applied to a tetrode-type p-channel structure. In fact, the floating gate only partially covers the channel region.

The memory element in FIG. 8 is a tetrode-type p-channel structure with two polycrystalline silicon gates. The n-type substrate 1, the p+-diffusions which constitute the drain 2 and source 2' regions as well as the field oxide 5 which separates the various elements are shown. The polycrystalline floating gate $G'_1$ is located on a 200 A thick thermally grown injection oxide 4 and, to increase the coupling, is spread over the field oxide 5 outside the active region. The floating gate $G'_1$ is n+-doped during or after being deposited in order to facilitate injection of electrons towards the substrate during erasure by field emission. It is capacitively coupled to a control electrode $G'_2$ made of p+-doped polycrystalline silicon via a 1,000 Å thermally grown oxide 3', this coupling being partially produced on the field oxide 5. The oxide 3' also forms the gate oxide of the control electrode $G'_2$ on the source side 2'. The source 2' and drain 2 regions as well as the control electrode $G'_2$ are doped simultaneously, for example with a doped oxide 9 covering the structure and insulating the control electrode $G'_2$.

The control electrode $G'_2$ as well as the drain 2 and source 2' regions are provided with contacts produced outside the plane of the section by metallizing through the insulating layer 9.

FIG. 9 is a plan view of the element in FIG. 8. It is, in fact, constituted by the mask plan which can be used for manufacturing the circuit. As with the preceeding embodiments, this memory element only requires a single additional mask relative to the above-mentioned CMOS technology. This additional mask is labelled $M_8$ and serves to etch the floating gate $G'_1$ and the injection oxide 4.

FIG. 10 shows the equivalent circuit of the memory element shown in FIGS. 8 and 9. The threshold voltage beneath the floating gate $G'_1$ will be proportional to the potential $V_{G'1}$ of this floating gate. This potential is related to the various parameters of the cell by the equation:

$$V_{G'1} = \frac{C_2}{C_T} V_{G'2} + \frac{C_D}{C_T} V_D + \frac{Q_{G'1}}{C_T}$$

with $Q_{G'1}$ is the charge on the floating gate $G'1$ and $$C_T = C_2 + C_3 C_1 + C_D$$

in which $C_2$ is the capacitance between the floating gate $G'_1$ and the control electrode $G'_2$, $C_3$, $C_1$ and $C_D$ are the capacitances between the floating gate $G'_1$ and the substrate 1 through the field oxide, the floating gate $G'_1$ and the substrate 1 through the injection oxide 4, and the floating gate $G'_1$ and the drain 2 respectively.

For example, with the following thicknesses d and the corresponding surface areas S of oxide:

injection oxide $d=200$ Å and $S=30$ $\mu m^2$ gate oxide $d=750$ Å and $S=654$ $\mu m^2$ field oxide $d=1000$ Å and $S=666$ $\mu m^2$ the capacitive coupling between the floating gate $G'_1$ and the control electrode $G'_2$, that is the ratio $\alpha = (C_2/C_T)$ is equal to 0.75. This means that the voltage at the floating gate $V_{G'1}$ is equal to 0.75 times the voltage $V_{G'2}$ applied to the control electrode $G'_2$.

The programming mechanisms of the memory element in FIGS. 8 and 9 are similar to those described above. The memory will be erased by using the mechanism of field emission of electrons from the n+ doped floating gate $G'_1$ towards the substrate 1 through the injection oxide 4. A voltage of about −30 volts is applied to the control electrode $G'_2$. Owing to the good capacitive coupling between the floating gate and the control electrode, a sufficiently strong electric field is created through the injection oxide to cause injection by the field emission of electrons from the floating gate $G'_1$ towards the substrate 1.

The n+-doping of the floating gate allows a very reproducible potential barrier to be obtained between the floating gate and the injection oxide. After erasure, the floating gate $G'_1$ has a positive charge which prevents the formation of a p-channel beneath it. If a voltage of −1.5 volts is applied to the control electrode $G'_2$ only the region situated beneath it is thus inverted. The memory element is thus in the O-state.

The programming of the memory element employs the avalanche mechanism of the $p^{30}$-n junction between the drain 2 and the substrate 1 by bringing the drain 2 to a potential of −25 volts. If the control electrode $G'_2$ is maintained at 0 volt, "hot" electrons which are sufficiently energetic will thus be injected through the injection oxide 4 in floating gate $G'_1$ which will thus charge negatively. The negative charge present at the floating gate $G'_1$ causes an inversion zone to be formed beneath the injection oxide 4. The memory element is thus in the 1-state. After this writing operation, the application of a voltage of −1.5 volts to the drain 2 and the control electrode $G'_2$ causes the inversion zone to be extended to the source 2' and permits the passage of a drain-source current. If, on the other hand, the control electrode $G'_2$ is brought to a voltage of −10 volts, the avalanche mechanism is not produced and the injection of negative charges into the floating gate $G'_1$ does not take place. The memory element thus rests in the 0-state. During the writing operation, the source 2' is left floating to prevent a parasitic drain-source current from being produced.

Figure 13:
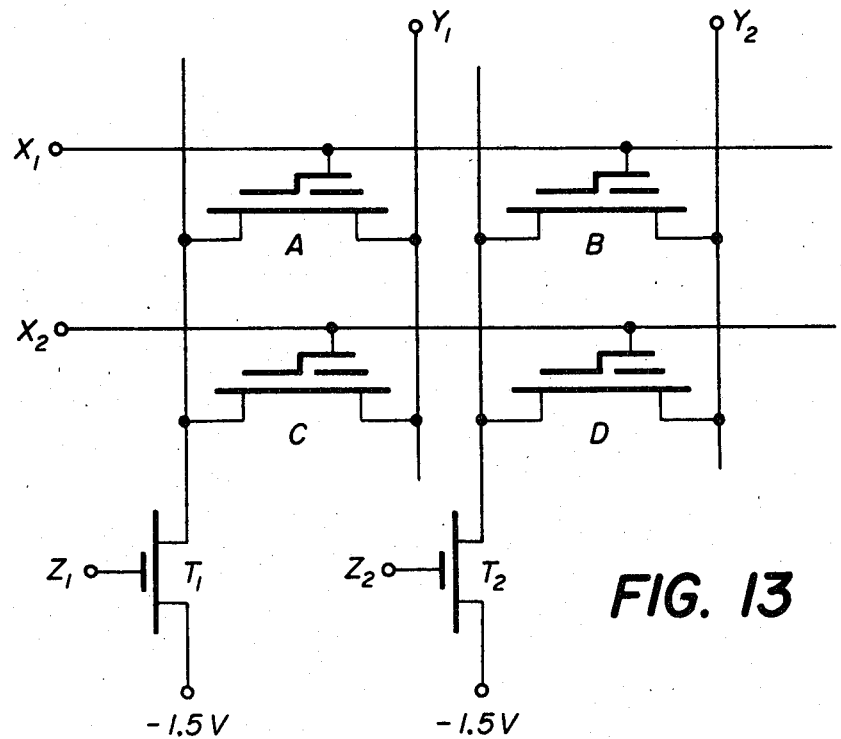
FIG. 13 shows a matrix arrangement of four memory elements according to FIG. 8.
Figure 11:
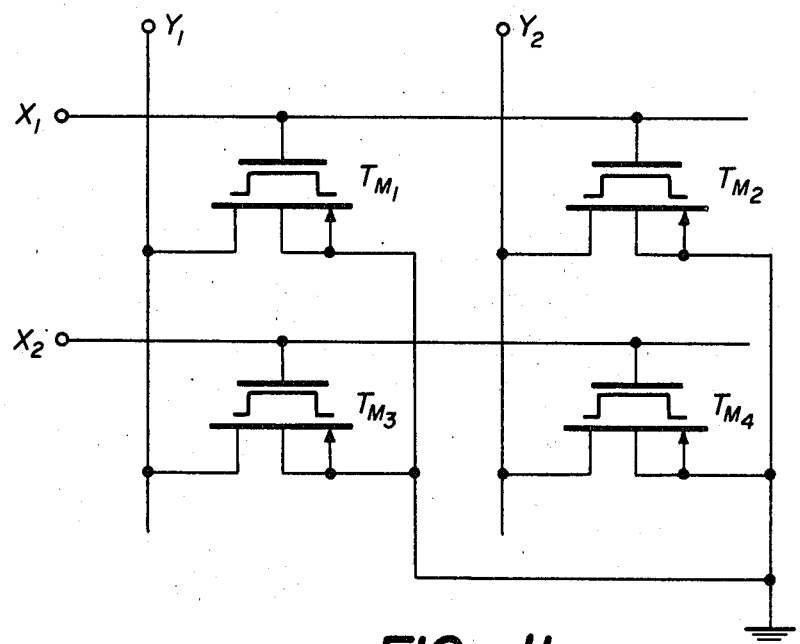
FIG. 11 shows a matrix arrangement of four memory elements as shown in FIGS. 5 and 7.

FIGS. 11 and 13 show how the memory element according to the invention can be arranged in matrix form. FIG. 11 shows an arrangement of four memory elements according to the first or second embodiment of the invention (FIGS. 5 and 7). The matrix arrangement comprises 4 elements $T_{M1}$ to $T_{M4}$. The control electrodes of the transistors in the same line are connected to a common connection $X_i(X_1, X_2 ...)$ and the drains of the transistors in the same column are connected by a common connection $Y_i(Y_1, Y_2 ...)$. The sources are connected to each other and connected to the substrate. Another solution would involve connecting the sources to the substrate individually.

The various voltages to be applied to the connections shown in FIG. 11 in order to programme and to read, for example, the memory element $T_{M1}$, are given in Table 1 below.

TABLE 1

| $T_{M1}$ | $X_1$ | $X_2$ | $Y_1$ | $Y_2$ |
|---|---|---|---|---|
| Reading | −10V | 0 | −1.5V | 0 or floating |
| Erasure | −30V | 0 | −1.5V or 0 or floating | −1.5V or 0 or floating |
| Writing "1" | 0 | 0 or −10V | −20V | −1.5V or 0 or floating |
| Writing "0" | −10V | −10V or 0 | −20V | −1.5V or 0 or floating |

No particular demands have to be met with regard to the form of the signals to be applied. By selecting pulses lasting 250 ms, with rise times of 50 ms, the avalanche writing currents obtained remain below 30 nA and the field emission erasure currents below 10 nA. This means that a large number of elements can be programmed at the same time.

It should be noted that writing is selective, element by element, and erasure is selective by lines.

The low currents and voltages occurring during the operation of a memory constituted by the elements according to the invention allow the control voltages to be generated by means of voltage multipliers which are integrated in the same circuit from a battery supply voltage of 1.5 V for example.

Figure 12:
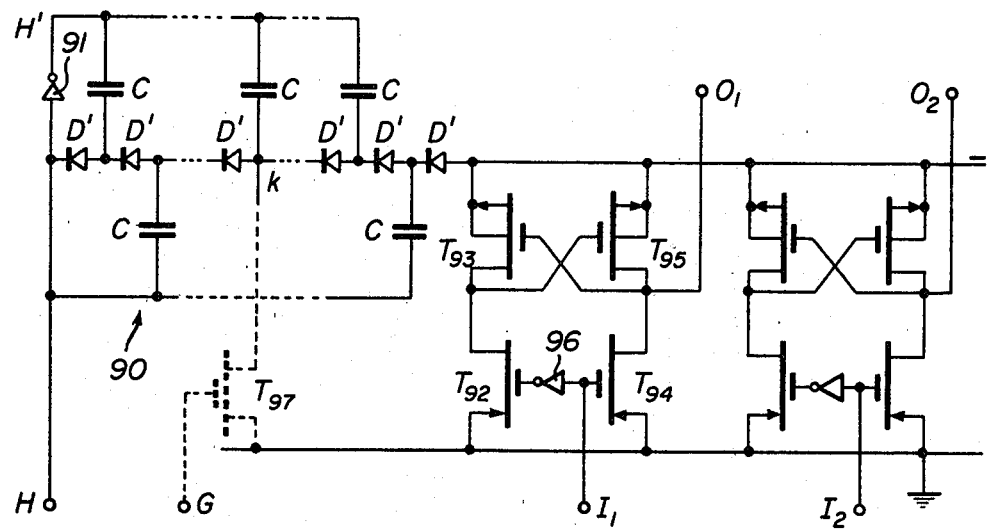
FIG. 12 shows an embodiment of a voltage multiplier and selection circuit which can be used in the arrangement in FIG. 11.

As an example, FIG. 12 shows a voltage multiplier and selection circuits which can be used with the matrix arrangement in FIG. 11. The diagram in FIG. 12 has already been described in German Patent Application No. 28 28 017 belonging to the applicants. Therefore, only the general operation thereof will be mentioned again hereunder.

The voltage multiplier 90 in FIG. 12 is supplied at H by high frequency pulses, these pulses appearing with opposite polarity at the output H' of an inverter 91. The negative voltage at the output of the voltage multiplier 90 is applied to two selection circuits each comprising two pairs of transistors such as $T_{92}$, $T_{93}$ and $T_{94}$, $T_{95}$, as well as an inverter 96.

Some low voltage control signals are applied at $I_1$ or $I_2$ to these selection circuits whose outputs $O_1$ and $O_2$ are connected, for example, to the connections $X_1$ and $X_2$, respectively, in FIG. 8.

If, for example, $I_1$ is at negative potential, the transistors $T_{94}$ and $T_{93}$ are conducting, whereas $T_{92}$ and $T_{95}$ are blocked. If $I_2$ is at positive or zero potential, the transistors $T_{94}$ and $T_{93}$ are blocked, whereas $T_{92}$ and $T_{95}$ are conducting and the high voltage from the voltage multiplier appears at the output $O_1$. At the moment of the transition of the state at input $I_1$, the output voltage from the multiplier lowers until switching into the other stable state of the selection circuit is effected and then rises with a time constant determined by the circuit elements and the frequency of the pulses applied at H. As the voltage multiplier has a high internal resistance, the selection circuits are able to operate with transistors having minimal dimensions.

The reading, the write control and the erasure of the present memory elements can be effected by means of the same voltage multiplier, using an arrangement of the type indicated in broken lines in FIG. 12.

The conduction path of a transistor $T_{97}$ is connected between a point k in the chain of diodes D' and ground. The transistor $T_{97}$ is controlled by signals G applied at G to its gate so as to ground the point k and to reduce the voltage supplied by the voltage multiplier, depending on the location of this point on the diode chain. Two or more different high voltages can thus be generated from a single voltage multiplier.

FIG. 13 shows four memory elements A,B,C and D as described in connection with FIGS. 8 to 10 and arranged in matrix form in two lines A-B and C-D and two columns A-C and B-D. The control electrodes of the elements in the same line are connected to the same terminal X1 or X2 and the drains of the elements in the same column are connected to the same terminal Y1 or Y2. The sources of the elements in the same column are connected to a −1.5 V source via a MOS transistor T1 or T2. Each transistor T1 or T2 can be made conductive by applying a voltage of −1.5 volts to its gate connected to a terminal Z1 or Z2 respectively.

The Table 2 given below summarises the various voltages to be applied to each terminal in order to read or programme the memory element A.

TABLE 2

| Element A | X1 | X2 | Y1 | Y2 | Z1 | Z2 |
|---|---|---|---|---|---|---|
| Reading | −1.5V | 0V | 0V | 0V | −1.5V | 0V |
| Erasure | −30V | 0V | 0V | 0V | 0V | 0V |
| Writing (1-state) | 0V | 0V or −10V | −25V | 0V | 0V | 0V |
| Writing (0-state) | −10V | 0V or −10V | −25V | 0V | 0V | 0V |

It will be noted that it is possible to write one column at a time and to erase one line at a time. With the same voltage pulse conventions as above, that is to say duration 250 milliseconds and rise time 50 milliseconds, the avalanche writing currents are less than 100 nanoamperes and the field emission erasure currents less than 10 nanoamperes. The currents and voltages required make these memories compatible with a voltage multiplier, as described above, which is integrated on the same circuit and supplied from a single voltage source of 1.5 volts.

Although the present invention has been described by means of particular embodiments, it is obvious, however, that it is not limited to the said examples and that it is open to variations or modifications without departing from the scope thereof.

We claim:

1. A non-volatile, electrically erasable and reprogrammable memory element comprising a single p-channel MOS transistor with a polycrystalline silicon floating gate capacitively coupled to a control electrode, wherein, said polycrystalline silicon floating gate is arranged, at least over a portion of the channel region, on a thin injection-type oxide and, outside the channel region, on a field oxide layer which is substantially thicker;

said control electrode covers said floating gate and is separated from said floating gate by at least one gate oxide layer which is substantially thicker than said injection-type oxide; and the thickness of said injection-type oxide and said gate oxide is chosen so that said floating gate can be negatively charged by avalanche of the drain-substrate junction and can be discharged by field emission of electrons from said floating gate towards the substrate by applying a negative voltage to said control electrode.

2. A non-volatile electrically erasable and reprogrammable memory element comprising a single p-channel MOS transistor with a polycrystalline silicon floating gate capacitively coupled to a control electrode, wherein, said polycrystalline silicon floating gate is arranged, at least over a portion of the channel region, on a thin injection-type oxide and, outside the channel region, on a field oxide which is substantially thicker;

said control electrode covers said floating gate and the channel region not covered by the floating gate, said control electrode being separated from said floating gate and from said channel region not covered by the floating gate, by at least one gate oxide layer which is substantially thicker than the said injection-type oxide; and the thickness of said injection-type oxide and said gate oxide is chosen so that said floating gate can be negatively charged by avalanche of the drain-substrate junction and can be discharged by field emission of electrons from said floating gate towards the substrate by applying a negative voltage to the said control electrode.

3. A memory element as claimed in claim 1 or claim 2 wherein said floating gate is arranged on said injection oxide in a first zone of the channel region situated on the drain side and in at least a second zone of said channel region, and wherein it is arranged on the field oxide in the other zones.

4. A memory element as claimed in claim 3 wherein said second channel region is situated on the source side.

5. A memory element as claimed in any preceding claim wherein the source region is produced by a p-doped well formed in the substrate.

6. A memory element as claimed in claim 1 or 2 wherein said floating gate is at least partially doped with an n-type dopant.

7. A memory element as claimed in claim 1 or 2 wherein said control electrode is produced from aluminum.

8. A memory element as claimed in claim 1 or 2 wherein said control electrode is produced from polycrystalline silicon.

9. A memory element as claimed in 2 wherein said floating gate only covers the channel region partially and on the drain side, and is separated therefrom by an injection-type oxide layer.

10. A memory element as claimed in claim 9 wherein said control electrode is made of polycrystalline silicon.

11. A memory element as claimed in claim 10 wherein said floating gate is doped with an n-type dopant and said control electrode is doped with a p-type dopant.

12. A memory element as claimed in any of claims 9 to 11 wherein said injection-type oxide is about 200 Å thick and said gate oxide is about 1,000 Å thick.

13. An integrated circuit comprising a plurality of memory elements as claimed in claim 1 arranged in matrix form, the circuit also comprising means for the supply and control of said memory elements, wherein said circuit is supplied from a single external voltage source and wherein said means for supply and control comprise an oscillator emitting high frequency pulses, a voltage multiplier supplying from the said oscillator pulses voltages having a value which is higher than that of said external voltage source, and selection circuits capable of applying, in response to external control signals, said voltages supplied by the multiplier to the electrodes of said memory element so as to write, erase or read them.

* * * * *